(12) United States Patent
Usselman

(10) Patent No.: US 9,108,285 B2
(45) Date of Patent: Aug. 18, 2015

(54) CORD CLAMP CURRENT SENSOR FOR DUST COLLECTOR

(71) Applicant: Black & Decker Inc., Newark, DE (US)

(72) Inventor: Robert A. Usselman, Foster Hill, MD (US)

(73) Assignee: BLACK & DECKER INC., Newark, DE (US)

( * ) Notice: Subject to any disclaimer, the term of this patent is extended or adjusted under 35 U.S.C. 154(b) by 237 days.

(21) Appl. No.: 13/835,128

(22) Filed: Mar. 15, 2013

(65) Prior Publication Data

US 2014/0261551 A1 Sep. 18, 2014

(51) Int. Cl.
| H02B 1/24 | (2006.01) |
| B23Q 11/00 | (2006.01) |
| A47L 9/28 | (2006.01) |
| A47L 7/00 | (2006.01) |
| G01R 1/22 | (2006.01) |
| G01R 1/067 | (2006.01) |
| G01R 19/00 | (2006.01) |

(52) U.S. Cl.
CPC ............ *B23Q 11/0046* (2013.01); *A47L 7/0095* (2013.01); *A47L 9/2842* (2013.01); *G01R 1/067* (2013.01); *G01R 1/22* (2013.01); *G01R 19/00* (2013.01); *Y10T 307/865* (2015.04)

(58) Field of Classification Search
CPC  B23Q 11/0046; A47L 7/0095; A47L 9/2842; Y10T 307/865; G01R 1/067; G01R 19/00; G01R 1/22
USPC ......................................................... 307/131
See application file for complete search history.

(56) References Cited

U.S. PATENT DOCUMENTS

| 3,535,593 A | 10/1970 | Schweitzer, Jr. |
| 3,706,032 A | 12/1972 | Vikstrom |
| 4,059,798 A | 11/1977 | Dierker et al. |
| 4,258,348 A | 3/1981 | Belfer et al. |
| D260,635 S | 9/1981 | Lockwood |

(Continued)

FOREIGN PATENT DOCUMENTS

| JP | 10165738 A | 6/1998 |
| JP | 2004195565 A | 7/2004 |

OTHER PUBLICATIONS

National Semiconductor—LMV321/LMV358/LMV324 Single/Dual/Quad General Purpose, Low Voltage, Rail-to-Rail Output Operational Amplifiers; © 2003 National Semiconductor Corporation; DS100060; www.national.com; (13 pages).

(Continued)

*Primary Examiner* — Daniel Cavallari
(74) *Attorney, Agent, or Firm* — Harness, Dickey & Pierce, P.L.C.

(57) ABSTRACT

A dust collection system includes a sensor body, a selection circuit, a detection circuit, and a motor control circuit. The sensor body detachably encircles a cord supplying power to a power tool. The cord includes a neutral conductor and a hot conductor. The sensor body houses sensors that, in response to current flow through the cord, generate sensor signals. The selection circuit generates a positive output signal in response to the sensor signals and generates a negative output signal in response to the sensor signals. The detection circuit generates a current detection signal in response to a comparison of the positive and negative output signals with a threshold. The motor control circuit selectively turns on a motor of the dust collection system in response to the current detection signal.

12 Claims, 14 Drawing Sheets

(56) References Cited

U.S. PATENT DOCUMENTS

| | | | |
|---|---|---|---|
| 4,717,872 | A | 1/1988 | Wagner et al. |
| 5,099,544 | A | 3/1992 | Yamamoto |
| 5,120,983 | A * | 6/1992 | Samann .................... 307/38 |
| 5,256,906 | A | 10/1993 | Tsuge et al. |
| 5,598,039 | A | 1/1997 | Weber |
| 5,606,767 | A | 3/1997 | Crlenjak et al. |
| 5,615,107 | A | 3/1997 | DeAngelis |
| 5,652,506 | A | 7/1997 | Sorenson et al. |
| 5,747,973 | A * | 5/1998 | Robitaille et al. ............ 323/239 |
| 5,955,791 | A | 9/1999 | Irlander |
| 6,044,519 | A | 4/2000 | Hendrix |
| 6,222,285 | B1 * | 4/2001 | Haley et al. .................. 307/129 |
| 6,624,622 | B2 | 9/2003 | Noh |
| 7,296,323 | B2 | 11/2007 | Hayama et al. |
| 7,556,457 | B2 | 7/2009 | Oda et al. |
| 7,750,621 | B1 * | 7/2010 | Liu ................................ 324/126 |
| 8,015,657 | B2 | 9/2011 | Beers et al. |
| 8,270,130 | B1 * | 9/2012 | McMullen ..................... 361/31 |
| 2004/0060145 | A1 | 4/2004 | Hayama et al. |
| 2006/0292924 | A1 | 12/2006 | Spiri et al. |
| 2008/0022479 | A1 | 1/2008 | Zhao |
| 2009/0183336 | A1 | 7/2009 | Kunz et al. |
| 2009/0229842 | A1 * | 9/2009 | Gray et al. ..................... 173/20 |
| 2009/0241283 | A1 | 10/2009 | Loveless et al. |
| 2012/0073077 | A1 | 3/2012 | Ishikawa et al. |
| 2013/0136549 | A1 * | 5/2013 | Appel et al. .................... 408/56 |

OTHER PUBLICATIONS

Fairchild Semiconductor; BAT54/A/C/S Schottky Diodes; Apr. 2012; © 2012 Fairchild Semiconductor Corporation; www.fairchildsemi.com; (3 pages).

Megger; MMC850 Multi-core AC digital clamp meter; www.megger.com; (2 pages).

TL431, TL431A, TL431B, TL432, TL432A, TL432B Adjustable Precision Shunt Regulators; © 2004, Texas Instruments Incorporated; SLVS543A, Aug. 2004 (p. 1-27).

* cited by examiner

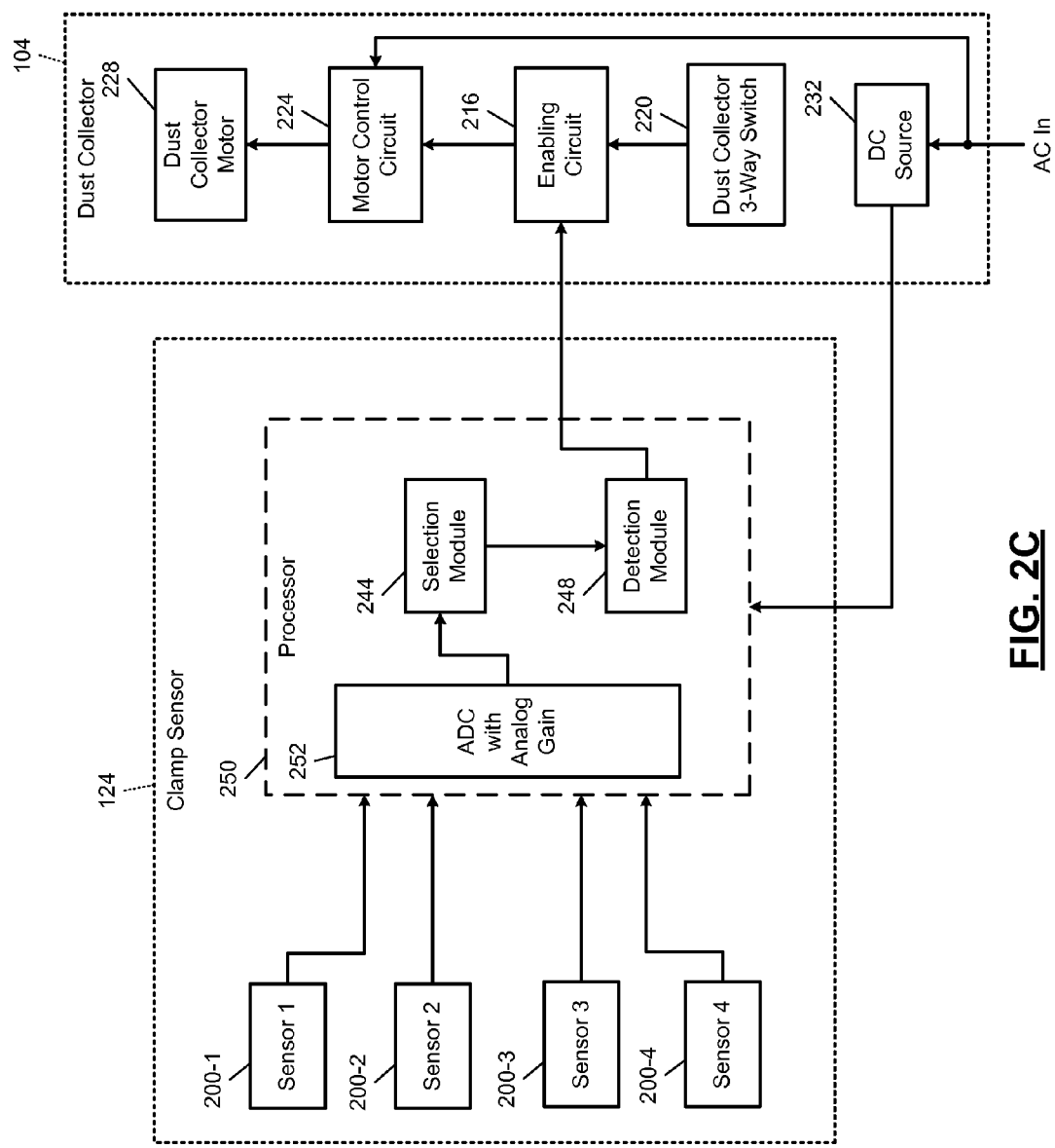

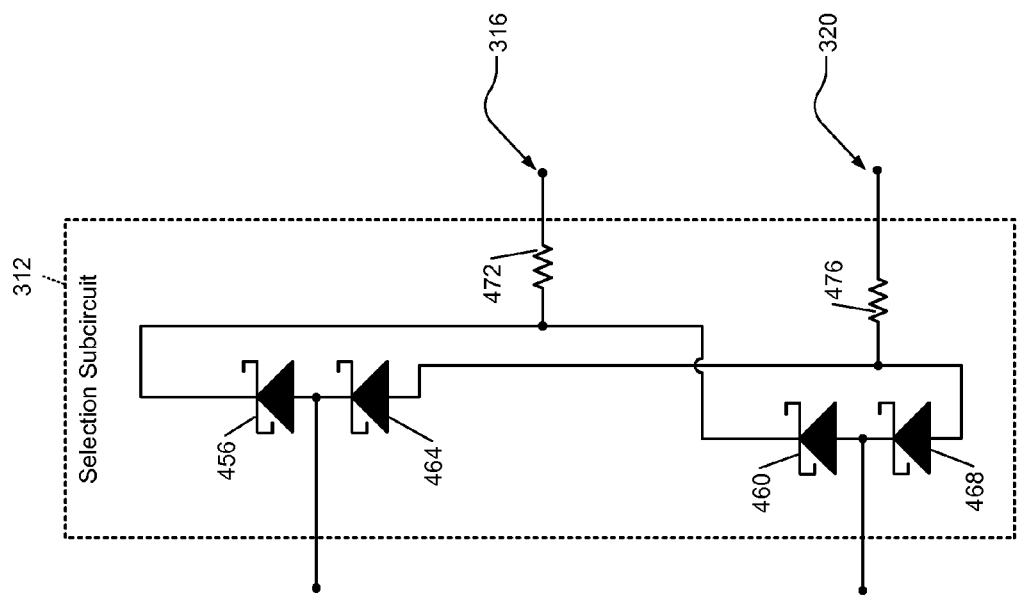

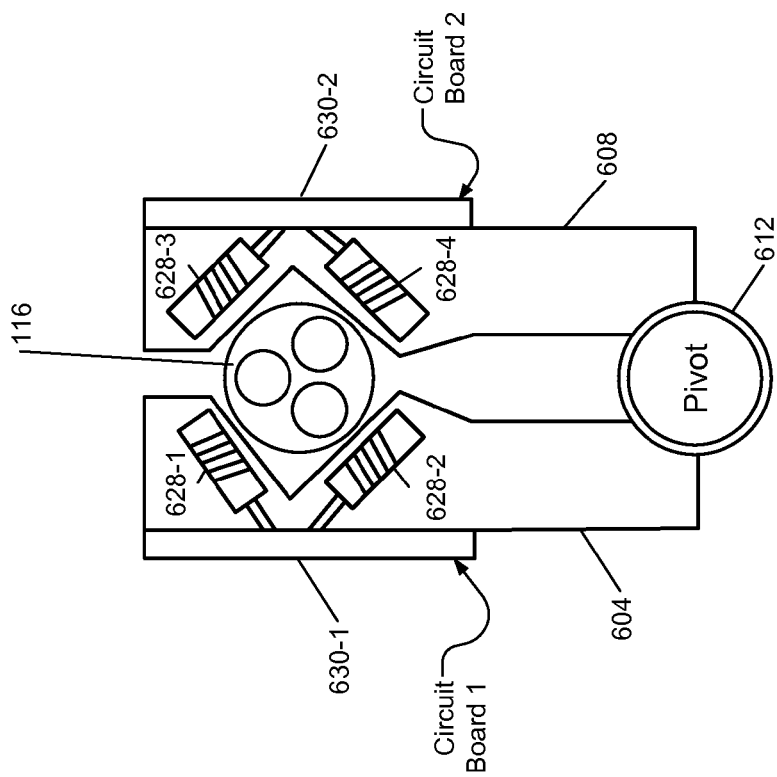
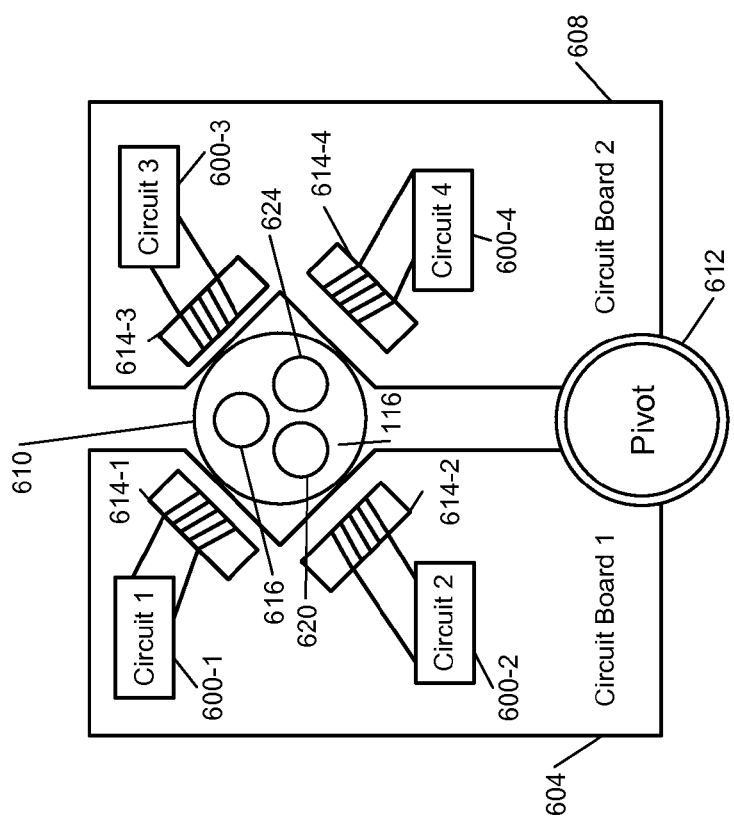

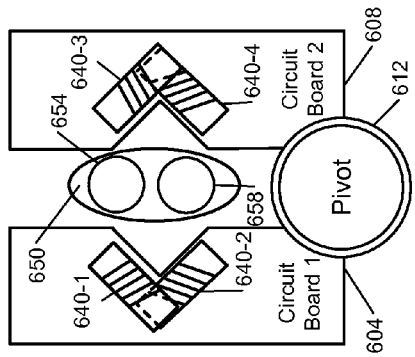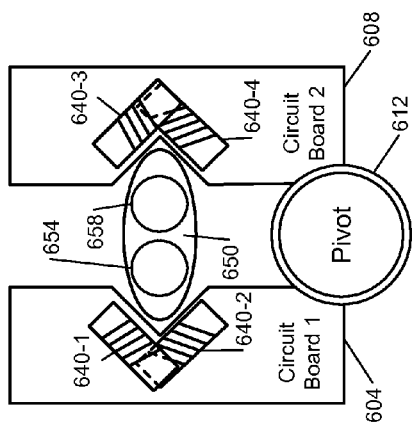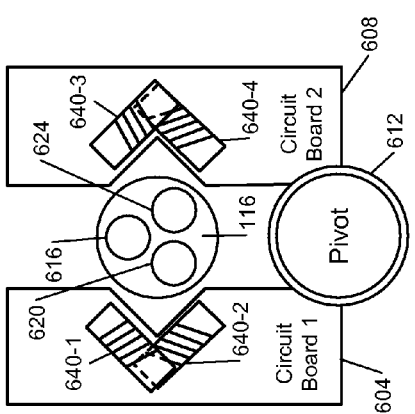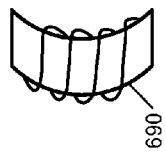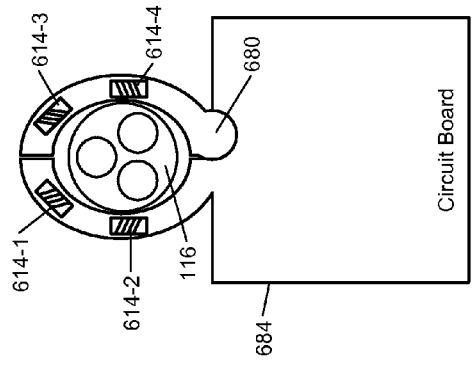

CORD CLAMP CURRENT SENSOR FOR DUST COLLECTOR

FIELD

The present disclosure relates to a dust collection system that operates in response to a detected current flow in a power cord of a power tool.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Working with a power tool, such as a sander or a grinder, often means being surrounded by a mass of dust and debris dispersed into the air by operation of the power tool. A user may desire to run a vacuum whenever he is operating the power tool. Presently available dust collection systems require connecting the power tool to the vacuum itself, which may increase the cost of the vacuum since the power handling requirements of the vacuum would be based on power consumed by the vacuum as well as the power tool. Inside the vacuum, the hot and neutral conductors supplying power to the power tool would be separated, and a current transformer around one or the other allows for current measurement. The vacuum turns on when current is sensed going to the power tool.

Other available dust collection systems require the user to plug the power tool into an AC line splitter, which has a female power plug for a power cord of the power tool, a male power plug for connecting to the wall (or an extension cord), and a middle section where the hot and neutral conductors are physically separated. A current transformer may be built into the AC line splitter to measure the current through one of the conductors. Alternatively, a snap around meter may be clamped around one of the separated conductors to measure current.

SUMMARY

A powered apparatus includes a loop structure, a detection circuit, and a control circuit. The loop structure includes an electromagnetic element and removably receives a cord supplying power to a second powered apparatus. The electromagnetic element senses current flow in the cord. The detection circuit generates a detection signal in response to the current flow exceeding a threshold value. The control circuit selectively turns on a motor of the powered apparatus in response to the generation of the detection signal.

A dust collection system includes a sensor body, a selection circuit, a detection circuit, and a motor control circuit. The sensor body detachably encircles a cord supplying power to a power tool. The cord includes a neutral conductor and a hot conductor. The sensor body houses sensors that, in response to current flow through the cord, generate sensor signals. The selection circuit generates a positive output signal in response to the sensor signals and generates a negative output signal in response to the sensor signals. The detection circuit generates a current detection signal in response to a comparison of the positive and negative output signals with a threshold. The motor control circuit selectively turns on a motor of the dust collection system in response to the current detection signal.

A method of operating a dust collection system includes attaching a sensor body around a cord supplying power to a power tool. The cord includes a neutral conductor and a hot conductor. The sensor body houses a plurality of sensors that, in response to current flow through the cord, generate a plurality of sensor signals. The method further includes generating a first output signal in response to the plurality of sensor signals, and generating a second output signal in response to the plurality of sensor signals. The method also includes generating a current detection signal in response to comparing the first and second output signals to a threshold, and selectively turning on a motor of the dust collection system in response to receiving the current detection signal.

Further areas of applicability of the present disclosure will become apparent from the detailed description, the claims and the drawings. The detailed description and specific examples are intended for purposes of illustration only and are not intended to limit the scope of the disclosure.

DRAWINGS

The present disclosure will become more fully understood from the detailed description and the accompanying drawings, wherein:

FIGS. 2A-2C are functional block diagrams of example implementations of the dust collection system;

FIG. 4B is a functional schematic of a selection circuit of the clamp current sensor;

FIG. 6A is a functional illustration of a top view of an example clamp current sensor including axial inductor coils;

FIG. 6B is a functional illustration of a top view of another example clamp current sensor in which circuit boards are arranged normal to the pivot plane of the clamp current sensor;

FIG. 6C is a functional illustration of a top view of another example clamp current sensor in which inductor coils are displaced axially;

FIGS. 6D and 6E are functional illustrations of an example clamp current sensor surrounding a two-conductor power cord;

FIG. 6F is a functional illustration of an alternative physical implementation of a clamp current sensor;

FIG. 6G is a graphical representation of an example curved inductor coil;

In the drawings, reference numbers may be reused to identify similar and/or identical elements.

DETAILED DESCRIPTION

Presently available dust collection systems capable of detecting current flow into a power tool require a user to disconnect the power tool from the source of power and connect the power tool to a special-purpose socket. The special-purpose socket may be built into the housing of the dust collector or may be attached to the dust collector. The power cord of a standard power tool contains two power-carrying conductors, whose magnetic fields cancel each other out. A traditional snap around meter would measure approximately zero current if snapped around both conductors at once. The special-purpose socket separates the two conductors from each other and allows a current measurement (such as with a current transformer) to be made around a single one of the separated conductors.

The special-purpose socket adds cost to the dust collection system, creates inconvenience for the user, and may limit the amount of current that can be drawn by the power tool. According to the present disclosure, a dust collection system uses a clamp sensor that snaps around the cord of the power tool to measure current, without the need for a special-purpose socket. The clamp sensor can be snapped around the cord of the power tool or around an extension cord (to which the power tool is connected) at any position along the length of the cord or extension cord.

The power tool may be plugged into a separate electrical outlet from the dust collector, and may even be on a different branch circuit. The separate electrical outlet may be more conveniently located for plugging in the power tool than an outlet located on a dust collector or a second outlet of a duplex receptacle into which the dust collector is plugged. The branch circuit used for the power tool may have a higher current handling capacity (e.g., 20 Amperes) than the branch circuit used for the dust collector (e.g., 15 Amperes).

Although described in the context of a dust collection system, the present disclosure is not so limited. The current sensing and operating aspects of this disclosure can be applied to other electrical devices that may be enabled based on operation of another device. For example only, a lubricant pump may be enabled based on operation of a milling machine or drill press (where the lubricant may be oil) or based on operation of a tile saw (where the lubricant may be water). In addition, the current sensing and responsive operating may be applied to adjust operating parameters of an electrical device. For example, an electrical generator may recognize a need to increase engine torque or engine speed to satisfy an increased current demand (and prevent or mitigate voltage sag) from a device consuming electrical power produced by the electrical generator.

Figure 1B:
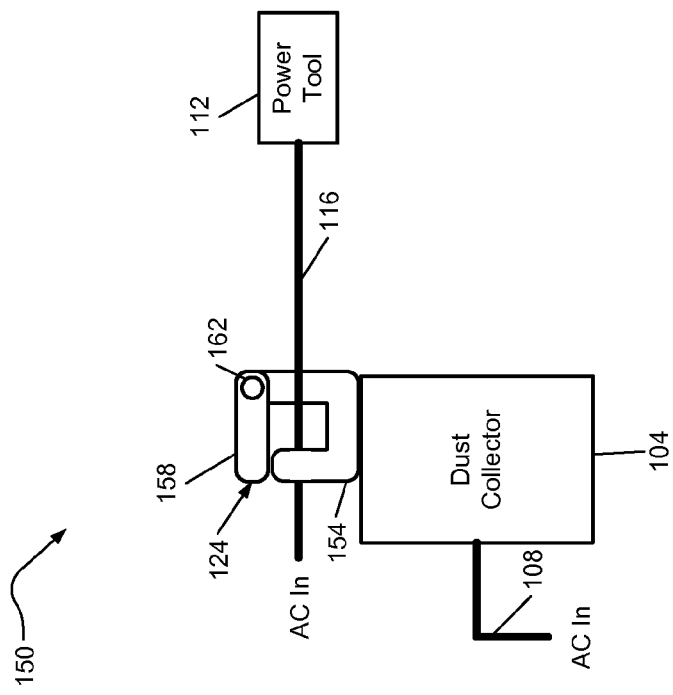
FIGS. 1A and 1B are high-level functional block diagrams of example implementations of a dust collection system.
Figure 1A:
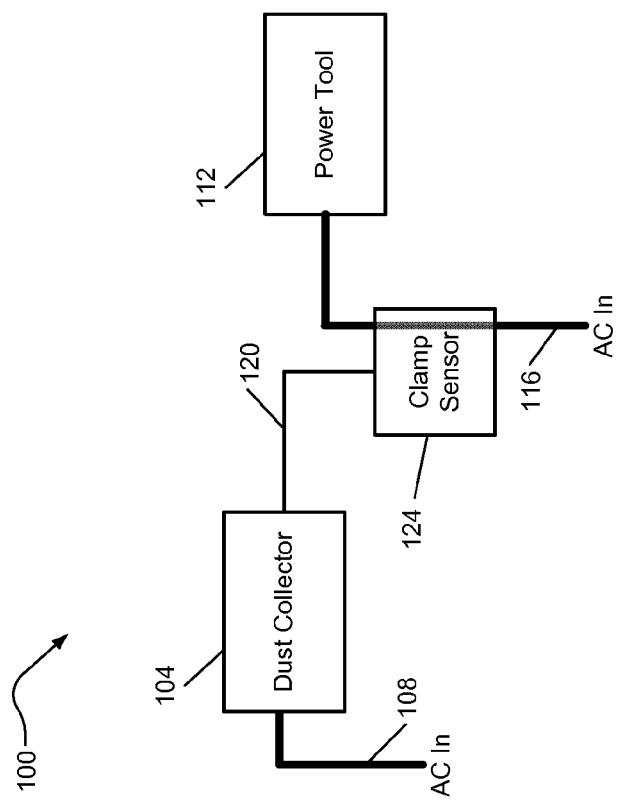

In FIG. 1A, a dust collection system 100 includes a dust collector 104 that connects to an AC outlet with a dust collector power cord 108. A power tool 112 is connected to a second AC outlet via a power cord 116 attached to the power tool 112, which in some cases is connected to the second AC outlet via an extension cord (not shown). The dust collector 104 interfaces via a wired connection 120 with a clamp sensor 124. In various implementations, the connection may be wireless, with the clamp sensor 124 powered by batteries or by power gleaned from the power cord 116. The clamp sensor 124 informs the dust collector 104 of current flowing to the power tool 112, which allows the dust collector 104 to be actuated when the power tool 112 is turned on.

The clamp sensor 124 wraps (or, snaps) around the power cord 116 at any point along the length of the power cord 116 or, when an extension cord is attached, at any point along the length of the power cord 116 or the extension cord. The clamp sensor 124 may have a spring-loaded pivot that allows a user to open jaws of the clamp sensor 124, insert the power cord 116 into the open jaws, and release the jaws of the clamp sensor 124 to secure the clamp sensor 124 around the power cord 116. In various implementations, the clamp sensor 124 may apply enough pressure to the power cord 116 for friction to prevent the clamp sensor 124 from freely sliding along the length of the power cord 116.

In FIG. 1B, another example implementation of a dust collection system 150 is presented. The clamp sensor 124 may be mounted directly to the housing of the dust collector 104 or be formed integrally with the housing. In an example implementation of the clamp sensor 124 shown in FIG. 1B, a stationary member 154 is attached to the dust collector, while a second member 158 is attached to the stationary member 154 by a pivot 162. The power cord 116, which supplies power to the power tool 112, is passed through the clamp sensor 124.

In various implementations, to save cost and/or to eliminate moving parts that may pose an increased risk of failure, the clamp sensor 124 may instead be implemented without the pivot 162, resulting in the stationary member 154 and the second member 158 being implemented as a single fixed body defining an opening for the power cord 116. In such a case, the power cord 116 would be fed through the clamp sensor 124. As a result, the opening defined in the clamp sensor 124 would be designed to be large enough for a standard power plug to fit through.

Figure 2A:
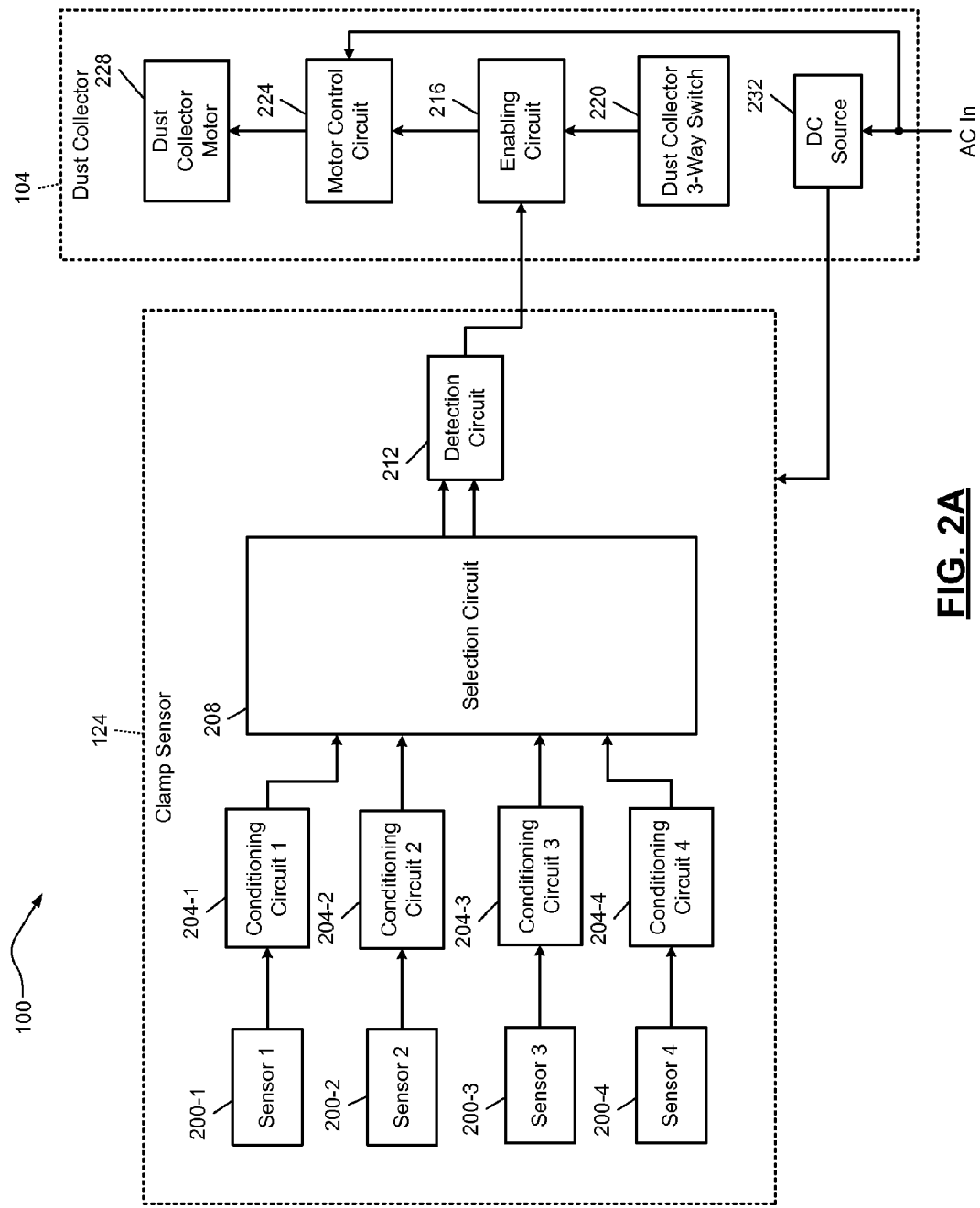

In FIG. 2A, an example implementation of the clamp sensor 124 includes sensors 200-1, 200-2, 200-3, 200-4 (collectively, sensors 200). Although four sensors are shown, the present disclosure may include three or more sensors. Various implementations may allow for two sensors to be used if an orientation of conductors in the power cord is controlled with respect to positions of the two sensors. The sensors 200 may be inductor coils radially positioned around the power cord 116 to detect the current flow through conductors of the power cord 116. The sensors 200 each generate a separate sensor signal in response to the current flow through the power cord 116. Each of the sensors 200 may be located more closely to a specific one of the conductors of the power cord 116 and therefore be more sensitive to the magnetic field of that conductor.

The sensors 200 provide the sensor signals to conditioning circuits 204-1, 204-2, 204-3, and 204-4 (collectively, conditioning circuits 204), respectively. The conditioning circuits 204 create conditioned signals by amplifying the respective sensor signals from the sensors 200. In various implementations, the conditioning circuits 204 also apply various analog processing, such as low-pass, high-pass, or band-pass filtering.

A selection circuit 208 receives the conditioned signals from the conditioning circuits 204. Because positions of the sensors 200 with respect to conductors of the power cord 116 are not tightly controlled (that is, the clamp sensor 124 may wrap around the power cord 116 at an arbitrary angle), the selection circuit 208 identifies which of the sensors 200 are receiving the strongest signal.

Specifically, in FIG. 2A, the selection circuit 208 generates a positive output signal by selecting a highest signal from among the conditioned signals, and generates a negative output signal by selecting a lowest signal from among the conditioned signals. A detection circuit 212 is connected to the selection circuit 208 and receives the positive output signal and the negative output signal. The detection circuit 212 generates a current detection signal in response to the positive and negative output signals. Specifically, the detection circuit 212 generates the current detection signal in response to a difference between the positive and negative output signals exceeding a threshold value.

The detection circuit 212 stops generating the current detection signal in response to the difference between the positive and negative output signals falling below the threshold value. In various implementations, the current detection signal may be conveyed in a binary signal over a conductor, where generating the current detection signal is performed by setting the conductor to an active level (such as a voltage corresponding to digital one). Meanwhile, stopping generating the current detection signal is performed by setting the conductor to an inactive level (such as a voltage corresponding to digital zero).

An example implementation of the dust collector 104 includes an enabling circuit 216, a dust collector switch 220, a motor control circuit 224, a dust collector motor 228, and a DC source 232. As indicated in FIG. 2A, the DC source 232 supplies DC power to the clamp sensor 124, which powers, for example, the conditioning circuits 204, the selection circuit 208, and the detection circuit 212. The DC source 232 may also supply power to the enabling circuit 216 and/or the motor control circuit 224.

The dust collector switch 220 has an on state, an off state, and an auto state. The enabling circuit 216 is connected to the detection circuit 212 of the clamp sensor 124 and controls whether the motor control circuit 224 will run the dust collector motor 228. For example, the enabling circuit 216 may generate an enable signal to command starting the dust collector motor 228 and stop generating the enable signal to command stopping the dust collector motor 228. The motor control circuit 224, when commanded to run the dust collector motor 228, may execute closed-loop or open-loop control to run the dust collector motor 228 at a predetermined speed, torque, and/or power.

When the dust collector switch 220 is in the off state, power may be removed from the motor control circuit 224 and/or the enabling circuit 216, automatically causing the dust collector motor 228 to stop. When the dust collector switch 220 is in the on state, the enabling circuit 216 generates the enable signal to command the motor control circuit 224 to run the dust collector motor 228.

When the dust collector switch 220 is in the auto state, the enabling circuit 216 generates the enable signal in response to the detection circuit 212 generating the current detection signal, indicating that current is flowing through the power cord. The enabling circuit 216 continues to generate the enable signal, while the dust collector switch 220 is in the auto state, for a predetermined period of time after generation of the current detection signal stops.

Figure 2B:
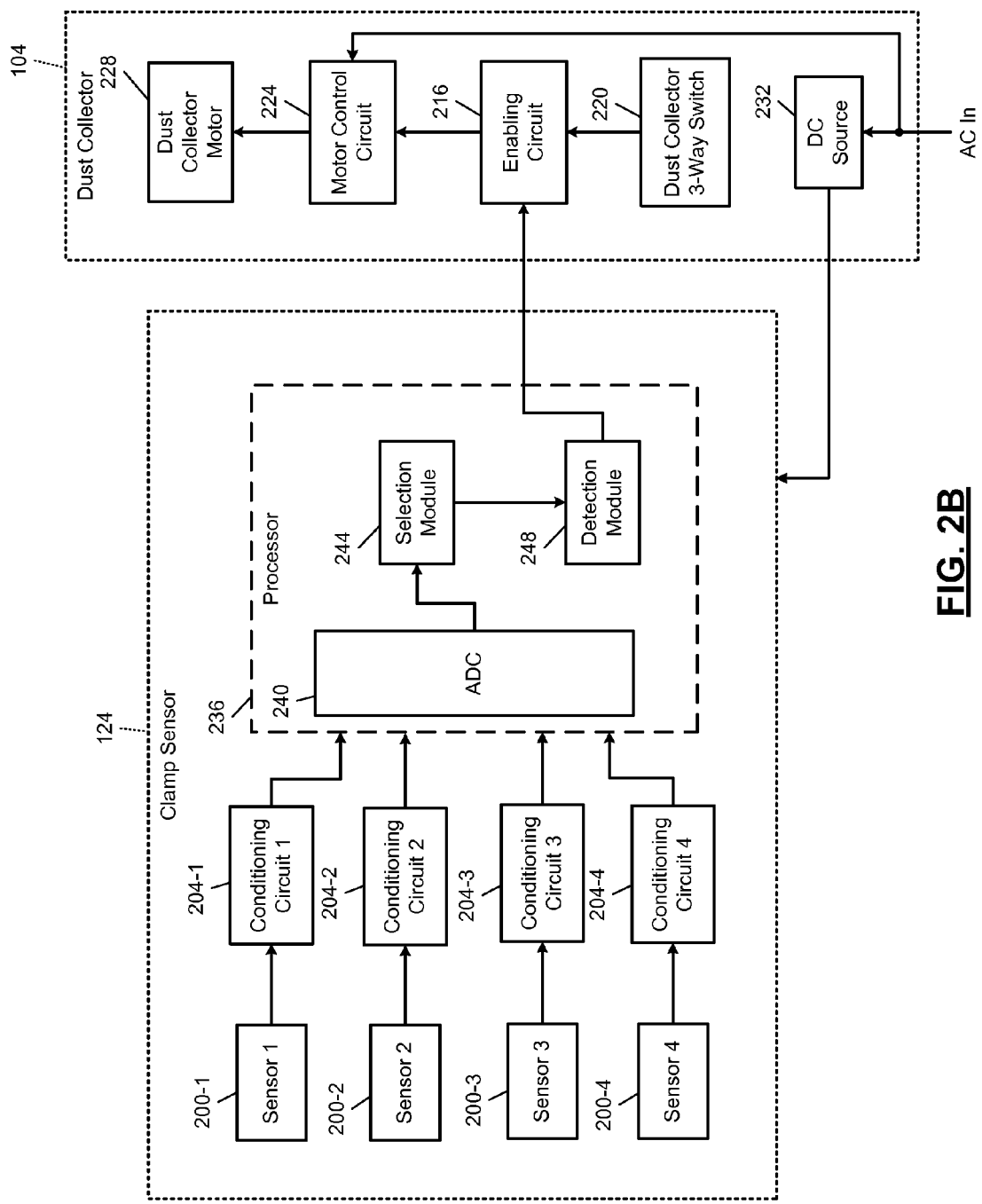

FIGS. 2B and 2C illustrate alternative example implementations of the clamp sensor 124. In FIG. 2B, a processor 236 receives the conditioned signals from the conditioning circuits 204. The processor 236 includes a built-in analog-to-digital converter (ADC) 240 that converts the conditioned signals from analog to digital. The ADC 240 may be multiplexed, converting each of the conditioned signals to digital in a repeating loop. Alternatively, the ADC 240 may include multiple ADC circuits to separately and simultaneously convert the conditioned signals to digital.

A selection module 244 of the processor 236 receives the digital signals and selects a highest one of the digital signals as a positive output signal. The selection module 244 also selects a lowest one of the digital conditioned signals as a negative digital output signal. A detection module 248 generates a current detection signal in response to the difference between the positive and negative output signals exceeding a threshold value. The detection module 248 stops generating the current detection signal in response to the difference between the positive and negative digital output signals falling below the threshold value.

In FIG. 2C, a processor 250 includes an ADC 252 with an analog gain (i.e., amplification) stage. The conditioning circuits 204 may therefore be eliminated. For example only, the ADC 252 may be implemented using a Cypress Semiconductor PSoC® (programmable system-on-chip). In various implementations, the sensors 200 are not separately powered and the DC source 232 provides power directly to the processor 250.

Figure 3A:
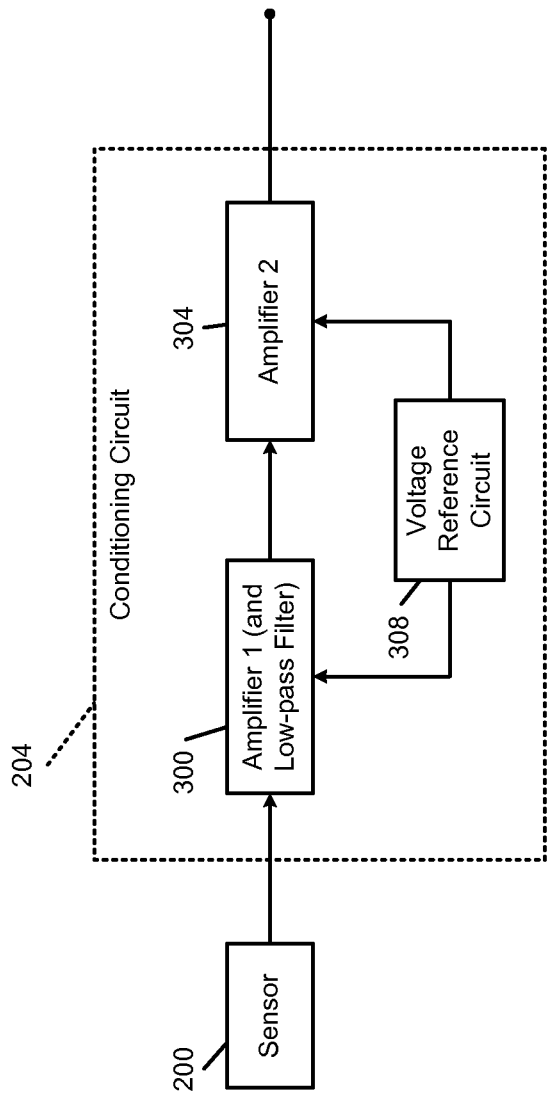
FIG. 3A is a functional block diagram of a conditioning circuit of a clamp current sensor.

In FIG. 3A, an example implementation of one of the conditioning circuits 204 includes a first amplifier 300 that amplifies a sensor signal from the sensor 200 and also performs low-pass filtering to remove noise and glitches. A second amplifier 304 further amplifies an output of the first amplifier 300. A voltage reference circuit 308 supplies a floating reference voltage to the first and second amplifiers, as discussed in more detail below.

Figure 3B:
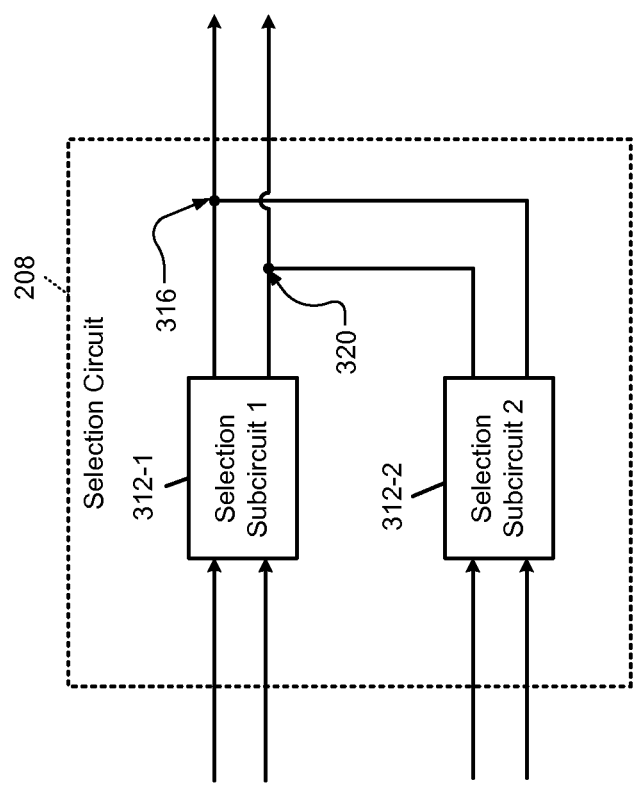
FIG. 3B is a functional block diagram of a selection circuit of the clamp current sensor.

In FIG. 3B, an example implementation of the selection circuit 208 includes selection sub-circuits 312-1 and 312-2 (collectively, selection sub-circuits 312). First and second inputs of the selection sub-circuit 312-1 receive first and second conditioned signals, respectively. A first output of the selection sub-circuit 312-1 is connected to a first node 316 and a second output of the selection sub-circuit 312-1 is connected to a second node 320.

First and second inputs of the selection circuit 312-2 receive third and fourth conditioned signals, respectively. A first output of the selection sub-circuit 312-2 is connected to the first node 316 and a second output of the selection sub-circuit 312-2 is connected to the second node 320. The selection circuit 208 outputs the highest one of the conditioned signals from the first node 316 and outputs the lowest one of the conditioned signals from the second node 320.

Figure 4A:
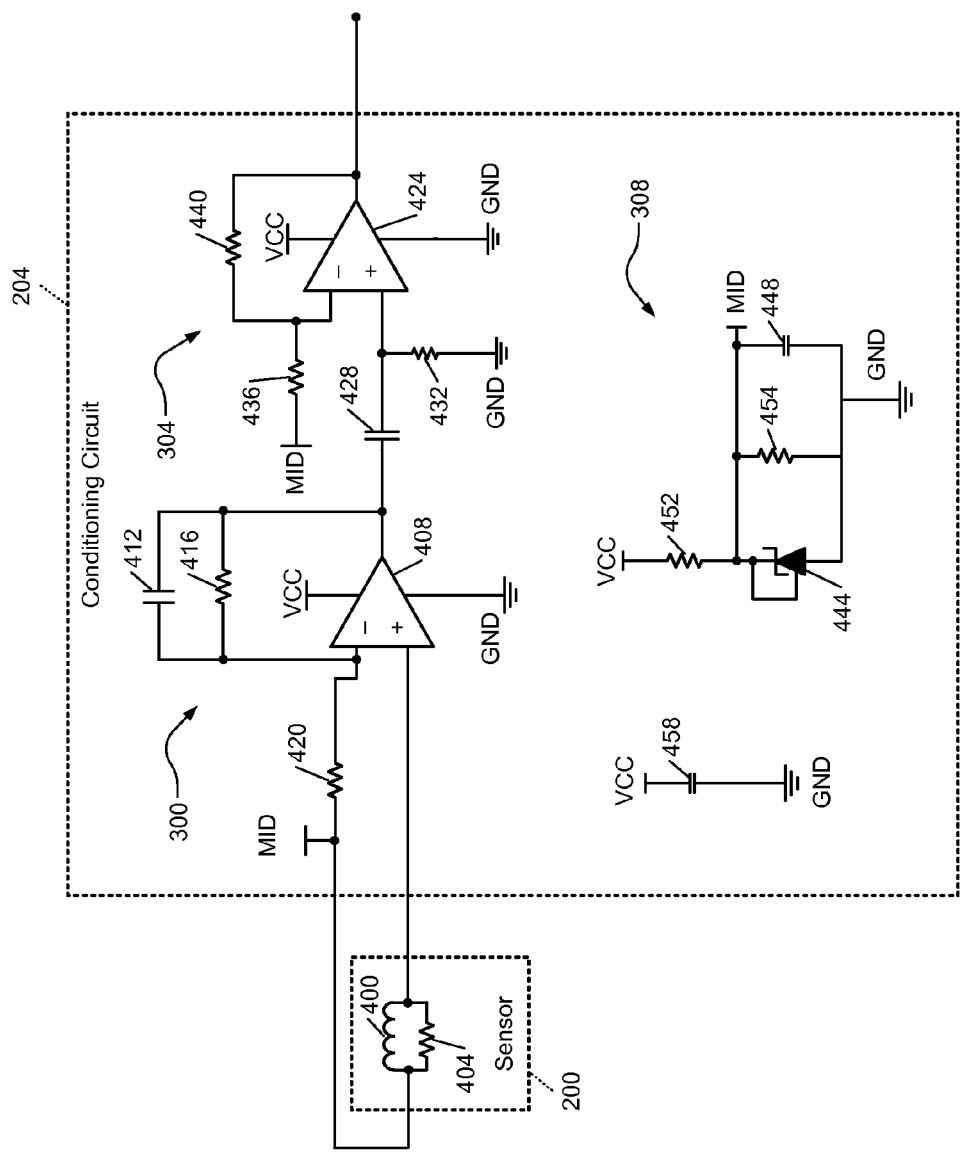
FIG. 4A is a functional schematic of a conditioning circuit of the clamp current sensor.

In FIG. 4A, an example implementation of one of the sensors 200 includes an inductor 400 and a resistor 404. Current flow through the power cord 116 induces a secondary current flow through the inductor 400 and the resistor 404 converts the induced current into a voltage. In an example implementation of one of the conditioning circuits 204, the first amplifier 300 includes an op-amp (operational amplifier) 408, a capacitor 412, a resistor 416, and a resistor 420.

The op-amp 408 is arranged in a noninverting configuration, and the values of the resistor 416 and the resistor 420 are chosen to provide a greater-than-unity gain, such as approximately 34. At high frequencies, the capacitor 412 reduces the gain of the first amplifier 300 toward unity, acting as a low-pass filter. Because the voltage across the resistor 404 may be positive or negative, a midpoint voltage reference (labeled as MID in FIG. 4A) is introduced as an AC ground. The single-ended op-amp 408 then swings between VCC and ground around the midpoint voltage reference.

The second amplifier 304 includes an op-amp 424 in a noninverting configuration. A coupling capacitor 428 allows the op-amp 424 to receive the output of the op-amp 408 without connecting the different DC bias points of the output of the op-amp 408 and the input of the op-amp 424.

A resistor 432 allows DC current to flow into a noninverting input of the op-amp 424. Resistors 436 and 440 create the noninverting configuration of the second amplifier 304 and are chosen to give a gain of greater than unity, such as approximately 11. The op-amp 424 amplifies the signal generated by the op-amp 408 to create the conditioned signal.

An example implementation of the voltage reference circuit 308 includes a regulator 444, a capacitor 448, and resistors 452 and 454. The regulator 444 is implemented as a Zener diode shunt regulator in FIG. 4A. Because the conditioning circuit 204 may be located at the far end of a fairly thin-gauge wire from a source of power, a capacitor 458 may be connected between VCC and ground to act as a decoupling capacitor and to prevent supply voltage sags in response to increased current demands.

In FIG. 4B, an example implementation of the selection sub-circuit 312 receives the first and second conditioned signals. The selection sub-circuit 312 includes diodes 456, 460, 464, and 468 connected in a full-wave rectifier configuration. The diodes 456, 460, 464, and 468 may be implemented as Schottky diodes.

The diodes 456, 460 are connected to the first node 316 via an optional diode protection resistor 472 and the diodes 464, 468 are connected to the second node 320 via an optional diode protection resistor 472. The resistors 472 and 476 can accommodate a high voltage drop, such as from static electricity, that might otherwise damage the diodes 456, 460, 464, or 468.

Figure 5:
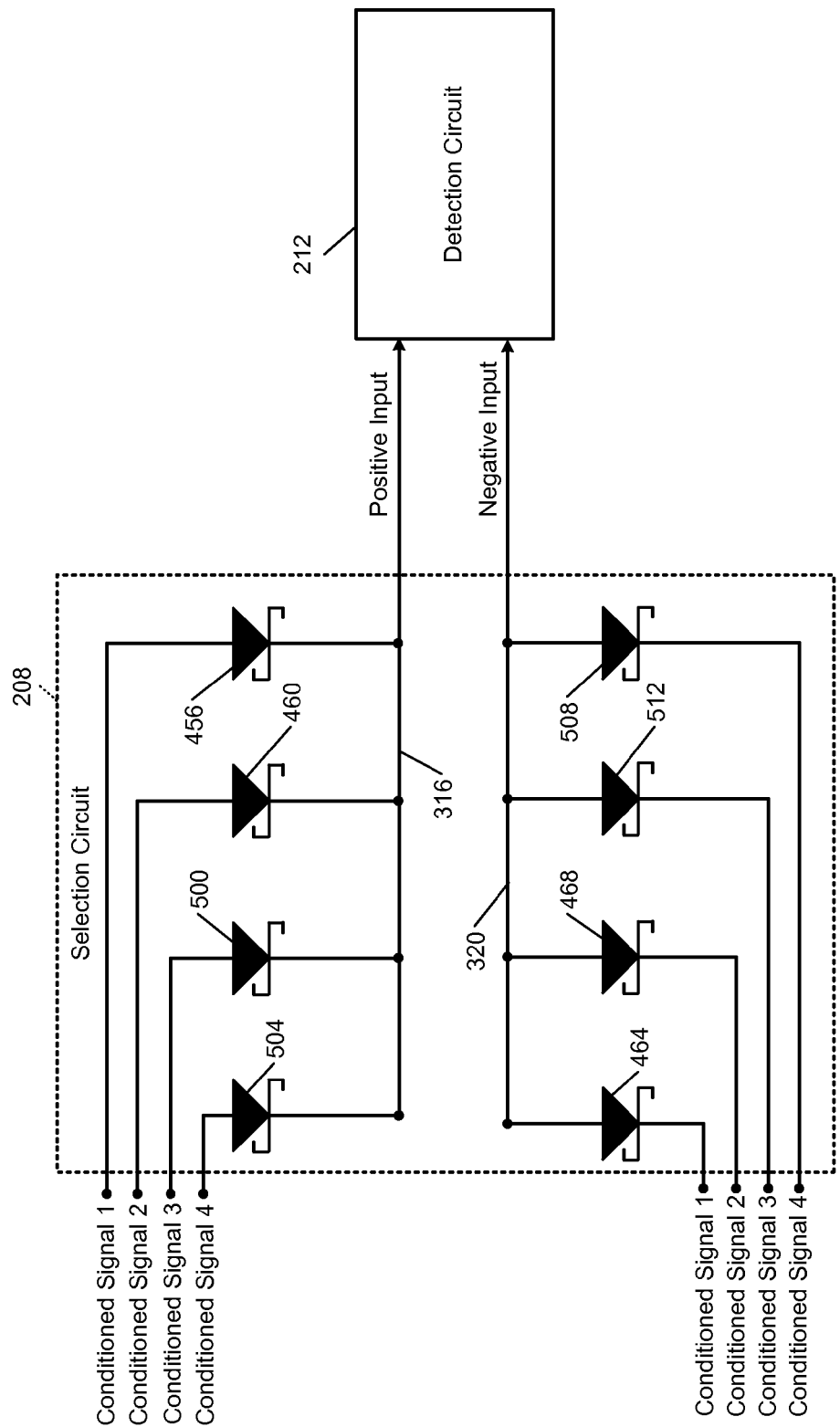
FIG. 5 is a schematic diagram of a selection circuit redrawn for purposes of illustration.

FIG. 5 is an example implementation of the selection circuit 208 drawn to graphically illustrate operation. The selection sub-circuit 312-1 includes the diodes 456, 460, 464, 468. The selection sub-circuit 312-2 includes diodes 500, 504, 508, and 512. Note that for purposes of illustration, each of the conditioned signals is shown in two locations in FIG. 5.

Each of the diodes 456, 460, 500, and 504 has an associated voltage drop when positively biased. For example only, if the associated voltage drop is 0.4 V, the voltage at the first node 316 is no more than 0.4 V below the first conditioned signal because of the diode 456. Additionally, the voltage at the first node 316 is no more than 0.4 V below the second conditioned signal because of the diode 460. Therefore, the voltage at the first node 316 is no more than 0.4 V below the highest of the conditioned signals.

Similarly, the diodes 464, 468, 508, and 512 reduce the voltage of the second node 320 to at most 0.4 V above the lowest of the conditioned signals. The detection circuit 212 therefore receives the highest of the conditioned signals and the lowest of the conditioned signals, offset only by the diode voltage drop. Although subtracting the negative input from the positive input may not yield an accurate current measurement, the difference is sufficiently responsive to detect the difference between the presence of current flow and the absence of current flow.

In FIGS. 6A-6F, example implementations of clamp sensors show the sensors 200 positioned so that when the clamp sensor is closed, the sensors 200 are spaced circumferentially around the power cord 116.

In FIG. 6A, a first clamp sensor jaw 604 and a second clamp sensor jaw 608 are connected by a pivot 612, which may be biased into a closed position by a spring (not shown). The clamp sensor jaws 604, 608 clamp around the power cord 116.

A sheath 610 of the power cord 116 surrounds a neutral conductor 616, a hot conductor 620, and a ground conductor 624. The first clamp sensor jaw 604 includes a first circuit board and the second clamp sensor jaw 608 includes a second circuit board, and the circuit boards are perpendicular to an axis of the power cord 116. The sensors 200 are implemented as inductive coils in FIGS. 6A-6F. Coils 614-1, 614-2 are positioned on the first circuit board and connected to circuits 600-1, 600-2, respectively. Similarly, coils 614-3, 614-4 are positioned on the second circuit board and connected to circuits 600-3, 600-4, respectively. The coils 614-1, 614-2, 614-3, and 614-4 (collectively, coils 614) are shown with an axial orientation.

The circuits 600-1, 600-2, 600-3, and 600-4 (collectively, circuits 600) may include conditioning circuits, and the circuit boards may also include the selection circuit 208 and the detection circuit 212 of FIG. 2A. In various implementations, the first selection sub-circuit 312-1 may be located on the circuit board in the first clamp sensor jaw 604 and the second selection sub-circuit 312-2 may be located on the circuit board in the second clamp sensor jaw 608.

FIG. 6B illustrates coils 628-1, 628-2, 628-3, and 628-4, which are shown with a radial orientation. In addition, first and second circuit boards 630-1 and 630-2 are arranged parallel with the axis of the power cord 116.

In FIG. 6C, the coils 640-1 and 640-2 are spaced apart in an axial direction with respect to the power cord 116 so that the coils 640-1 and 640-2 can be positioned closer together. In various implementations, the sensor 640-1 is offset ninety degrees from the sensor 640-2. Coils 640-3 and 640-4 are similarly positioned in the body of the second clamp sensor jaw 608.

FIGS. 6D-6E illustrates a 2-conductor power cord 650 including a hot conductor 654 and a neutral conductor 658. Although FIGS. 6D and 6E depict only two orientations of the power cord 650, positions of the coils 640 may be chosen so that any orientation of the power cord 650 will allow for current detection. In various implementations, the same clamp sensor may be used interchangeably with two-conductor or three-conductor power cords.

FIG. 6F shows another example implementation of the clamp sensor. A pivoting arm 680 is attached to a body 684, which includes a circuit board. Some of the coils 614, such as coils 614-1 and 614-2 are positioned on the body 684 while others of the coils 614, such as coils 614-3 and 614-4, are positioned on the pivoting arm 680.

In FIG. 6G, an alternative inductive coil 690 is shown, where the core is not cylindrical but is instead C-shaped. The coil 690 can be used in place of some or all of the coils 614, 628, and 640.

Figure 7A:
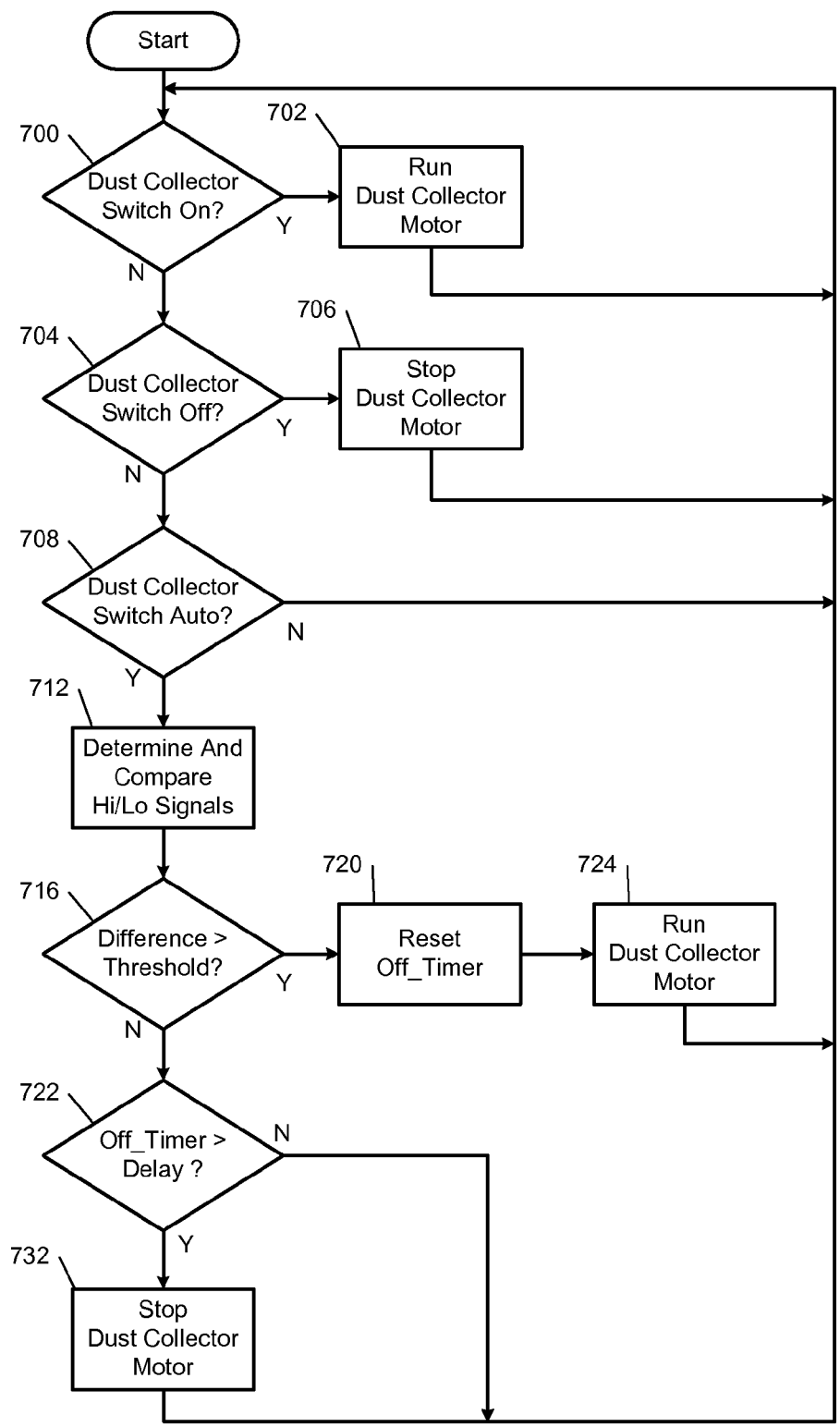
FIG. 7A is a flowchart illustrating a process for enabling a dust collector motor in response to a current detection signal generation.

In FIG. 7A, a process executed by the dust collection system 100 begins at 700. If the dust collector switch 220 is in the on state, control transfers to 702; otherwise, control transfers to 704. At 702, control causes the dust collector motor to run and control returns to 700. At 704, control determines whether the dust collector switch 220 is in the off state. If so, control transfers to 706; otherwise, control transfers to 708. At 706, control causes the dust collector motor to stop running and control returns to 700.

At 708, control determines whether the dust collector switch is in the auto state. If so, control transfers to 712; otherwise, control returns to 700. At 712, control conditions sensor signals, determines a highest one of the conditioned sensor signals, and determines a lowest one of the conditioned sensor signals. Control then determines the difference between the highest signal and lowest signal.

At 716, control compares the difference to a threshold value. In response to the difference exceeding the threshold value, meaning that current has been detected in the power cord, control transfers to 720; otherwise, control transfers to 722. At 720, control resets an Off_Timer, which tracks the amount of time since current has not been detected in the power cord. At 724, control causes the dust collector motor to run and returns to 700.

At 722, current is no longer detected, so if the Off_Timer is greater than a time delay, control transfers to 732, where control causes the dust collector motor to stop (or remain stopped). Control then returns to 700. The time delay controls how long the dust collector motor should remain running after the power tool has shut off. The time delay also prevents spurious shut-offs that may occur if control temporarily fails to detect current in the power cord. If, at 722, the Off_Timer is not yet greater than the time delay, control simply returns to 700.

Figure 7B:
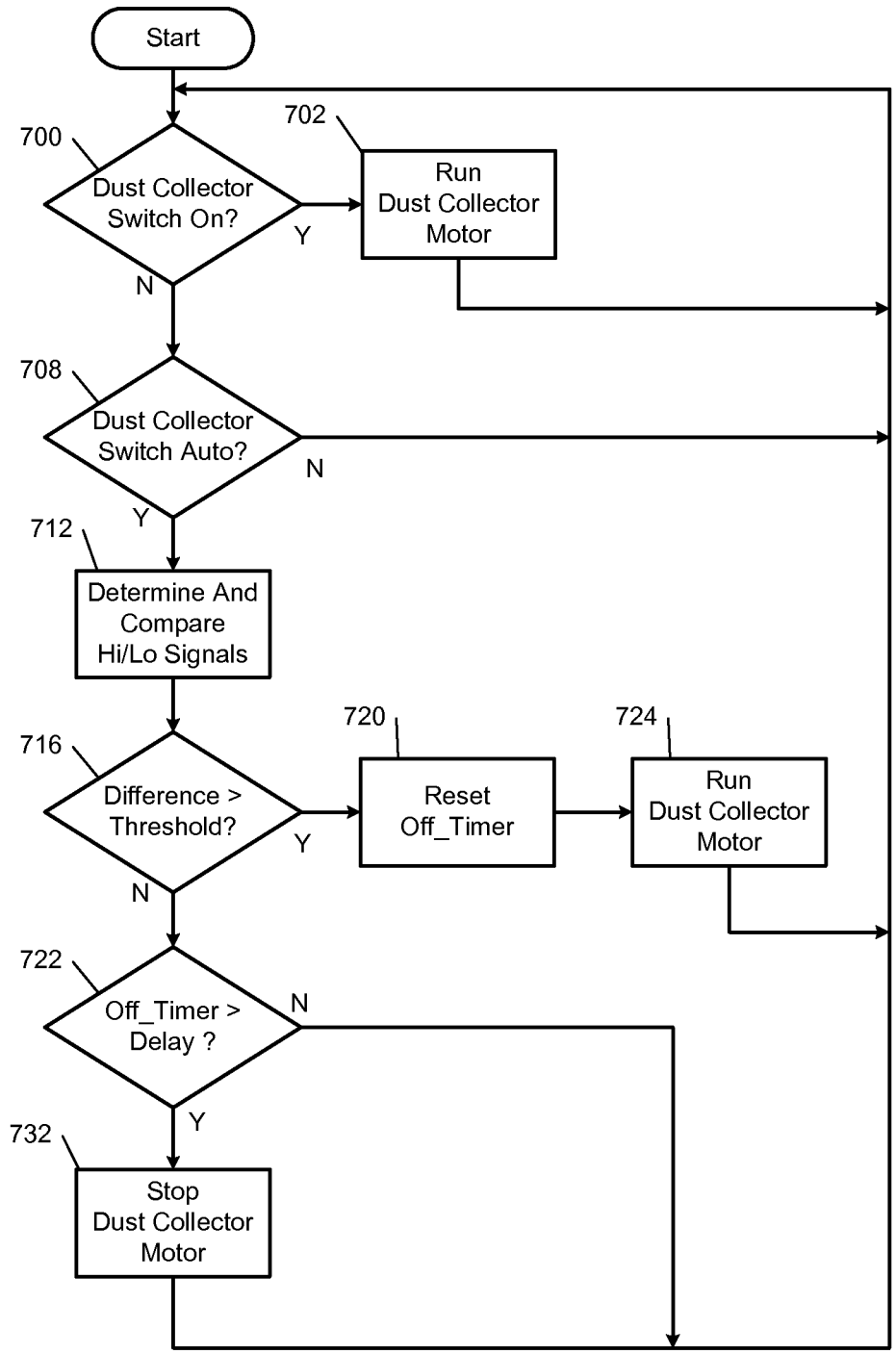
FIG. 7B is a flowchart illustrating a process executed by a processor that is powered when a dust collector switch is not in an off state.

FIG. 7B is similar to FIG. 7A, with 704 and 706 being omitted. In various implementations, a processor executing the control shown in FIG. 7B will not receive power and will therefore be off when the dust collector switch 220 is in the off state. As a result, the processor will never reach 706 of FIG. 7A, because once the dust collector switch 220 is in the off state, operation of the processor will stop.

Figure 7C:
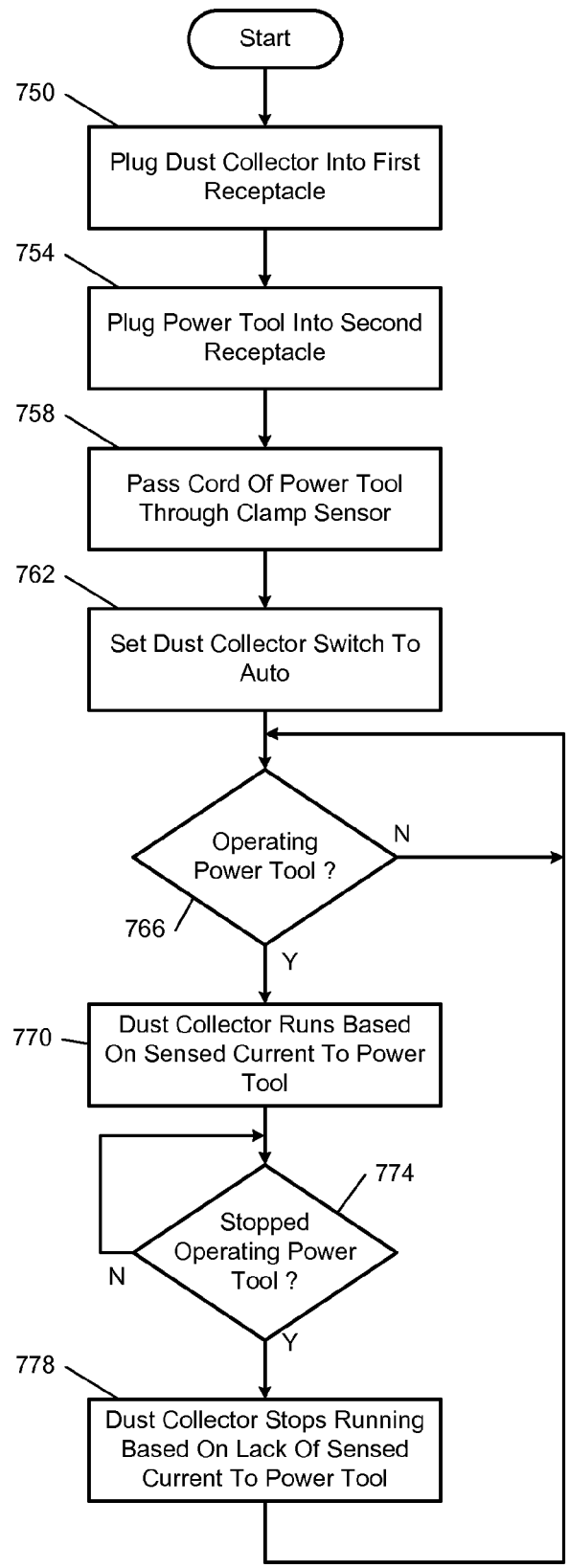
FIG. 7C is a flowchart illustrating a process performed by a user in order to automatically actuate a dust collector while operating a power tool.

In FIG. 7C, a user begins automatic dust collection operation at 750 by plugging the dust collector into a first receptacle. At 754, the user plugs the power tool into a second receptacle. At 758, the user passes the cord of the power tool through the clamp sensor. For example, this may involve opening a jaw or moving member of the power tool, placing the cord in the opening of the clamp sensor, and closing (or allowing to close) the moving member. In implementations where the clamp sensor has no moving parts, the cord may be passed through the clamp sensor prior to plugging the power tool into the second receptacle. At 762, the user sets a switch on the dust collector to an auto position.

At 766, when the user begins operating the power tool, control transfers to 770; otherwise, control remains at 766. At 770, the dust collector runs in response to sensing that current is being provided to the power tool. At 774, if operation of the power tool has stopped, control transfers to 778; otherwise, control remains at 774. At 778, the dust collector stops running in response to sensing that current is no longer being provided to the power tool. In various implementations, the dust collector may stop running after a predetermined delay following the operation of the power tool having stopped. Control then returns to 766.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

In this application, including the definitions below, the term module may be replaced with the term circuit. The term module may refer to, be part of, or include an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor (shared, dedicated, or group) that executes code; memory (shared, dedicated, or group) that stores code executed by a processor; other suitable hardware components that provide the described functionality; or a combination of some or all of the above, such as in a system-on-chip.

The term code, as used above, may include software, firmware, and/or microcode, and may refer to programs, routines, functions, classes, and/or objects. The term shared processor encompasses a single processor that executes some or all code from multiple modules. The term group processor encompasses a processor that, in combination with additional processors, executes some or all code from one or more modules. The term shared memory encompasses a single memory that stores some or all code from multiple modules. The term group memory encompasses a memory that, in combination with additional memories, stores some or all code from one or more modules. The term memory may be a subset of the term computer-readable medium. The term computer-readable medium does not encompass transitory electrical and electromagnetic signals propagating through a medium, and may therefore be considered tangible and non-transitory. Non-limiting examples of a non-transitory tangible computer readable medium include nonvolatile memory, volatile memory, magnetic storage, and optical storage.

The apparatuses and methods described in this application may be partially or fully implemented by one or more computer programs executed by one or more processors. The computer programs include processor-executable instructions that are stored on at least one non-transitory tangible computer readable medium. The computer programs may also include and/or rely on stored data.

What is claimed is:

1. A dust collection system comprising:
    a sensor body detachably encircling a cord supplying power to a power tool, wherein
    the cord includes a neutral conductor and a hot conductor, and
    the sensor body houses a plurality of sensors that, in response to current flow through the cord, generate a plurality of sensor signals;
    a selection circuit that generates a positive output signal in response to the plurality of sensor signals and generates a negative output signal in response to the plurality of sensor signals;
    a detection circuit that generates a current detection signal in response to a comparison of the positive and negative output signals with a threshold; and
    a motor control circuit that selectively turns on a motor of the dust collection system in response to the current detection signal.

2. The dust collection system of claim 1 wherein the detection circuit generates the current detection signal in response to a difference between the positive and negative output signals exceeding the threshold.

3. The dust collection system of claim 2 wherein the detection circuit stops generating the current detection signal in response to the difference between the positive and negative output signals falling below the threshold.

4. The dust collection system of claim 1 wherein the cord supplying power to the power tool is (i) an extension cord or (ii) a cord coupled to a body of the power tool.

5. The dust collection system of claim 1 further comprising an enabling circuit that generates an enable signal in response to generation of the current detection signal, wherein the motor control circuit turns on the motor of the dust collection system in response to generation of the enable signal.

6. The dust collection system of claim 5 wherein:
    a switch of the dust collection system has an on state, an off state, and an auto state, and
    the enabling circuit generates the enable signal in response to generation of the current detection signal while the switch is in the auto state.

7. The dust collection system of claim 6 wherein the enabling circuit continues generating the enable signal, while the switch remains in the auto state, for a predetermined period of time after generation of the current detection signal stops.

8. The dust collection system of claim 1 wherein the selection circuit generates the positive output signal by selecting a highest signal based on the plurality of sensor signals and generates the negative output signal by selecting a lowest signal based on the plurality of sensor signals.

9. The dust collection system of claim 1 wherein the plurality of sensor signals are amplified to create a plurality of conditioned signals, respectively, and wherein the selection circuit generates the positive and negative output signals in response to the plurality of conditioned signals.

10. The dust collection system of claim 1 wherein each of the plurality of sensors comprises an inductive coil.

11. The dust collection system of claim 1 wherein the plurality of sensors comprises at least four sensors.

12. The dust collection system of claim 11 wherein:
the selection circuit includes a first full-wave rectifier and a second full-wave rectifier,
first and second inputs of the first full-wave rectifier receive signals based on first and second sensors of the plurality of sensors, respectively,
a first output of the first full-wave rectifier is connected to a first node,
a second output of the first full-wave rectifier is connected to a second node,
first and second inputs of the second full-wave rectifier receive signals based on third and fourth sensors of the plurality of sensors, respectively,
a first output of the second full-wave rectifier is connected to the first node,
a second output of the second full-wave rectifier is connected to the second node,
a voltage of the first node is output from the selection circuit as the positive output signal, and
a voltage of the second node is output from the selection circuit as the negative output signal.

* * * * *